United States Patent [19]

Chapman

[11] Patent Number: 4,908,327
[45] Date of Patent: Mar. 13, 1990

[54] COUNTER-DOPED TRANSISTOR

[75] Inventor: Richard A. Chapman, Dallas, Tex.

[73] Assignee: Texas Instruments, Incorporated, Dallas, Tex.

[21] Appl. No.: 189,262

[22] Filed: May 2, 1988

[51] Int. Cl.$^4$ ............... H01L 21/265; H01L 21/70
[52] U.S. Cl. .................................. 437/44; 437/34; 437/56; 437/57; 437/41; 437/27; 437/28; 437/29; 357/23.3
[58] Field of Search ................. 357/42, 91, 23.3; 437/34, 41, 44, 27, 28, 29, 56, 57

[56] References Cited

U.S. PATENT DOCUMENTS

| | | | |
|---|---|---|---|
| 4,406,710 | 9/1983 | Davies et al. | 437/34 |
| 4,420,344 | 12/1983 | Davies et al. | 437/34 |
| 4,435,896 | 3/1984 | Parrillo et al. | 437/34 |
| 4,530,150 | 7/1985 | Shirato | 437/34 |
| 4,577,391 | 3/1986 | Hsia et al. | 437/44 |
| 4,590,663 | 5/1986 | Haken | 437/34 |
| 4,599,789 | 7/1986 | Gasner | 437/34 |
| 4,642,878 | 2/1987 | Maeda | 437/34 |
| 4,746,624 | 5/1988 | Cham et al. | 437/44 |
| 4,753,898 | 6/1988 | Parrillo et al. | 437/34 |
| 4,764,477 | 8/1988 | Chang et al. | 437/34 |
| 4,771,014 | 9/1988 | Liou et al. | 437/44 |

Primary Examiner—Brian E. Hearn
Assistant Examiner—M. Wilczewski
Attorney, Agent, or Firm—Douglas A. Sorensen; Rodney M. Anderson; Melvin Sharp

[57] ABSTRACT

P channel and N channel CMOS FETs (22, 24) and a process for their simultaneous fabrication with a minimal number of masking steps are disclosed. After formation of gates (30, 32) for both P channel FETs (24) and N channel FETs (22), a first N type dopant implanting step forms lightly doped drain extensions in both the P channel FETs (24) and the N channel FETs (22). A mask then protects the N channel FET area (22) while a P type dopant is implanted in source and drain regions (36) of the P channel FET (24) at a greater concentration than the prior implanted N type dopant. Another N type dopant implant occurs to both the P channel FET (24) and N channel FET (22). The N type dopant dosage used in this second N type dopant implantation step is greater than the dosage used in the first N type dopant implantation step. Another mask is used to protect the N channel FET (22) while a second P type dopant is implanted into source and drain regions of the P channel FET (24) at a greater concentration than is used in any of the previous implantation steps. Due to the high diffusion rate of the P type dopant, an annealing step drives the P type dopant so that the P channel FET (24) source and drain regions (36) reach the active transistor region underneath the gate.

19 Claims, 2 Drawing Sheets

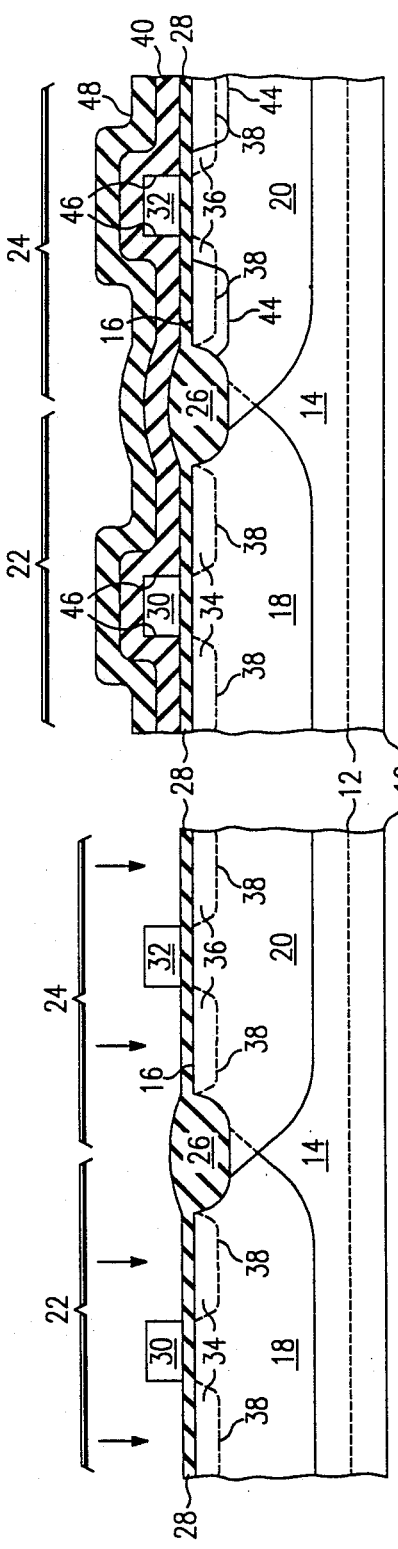
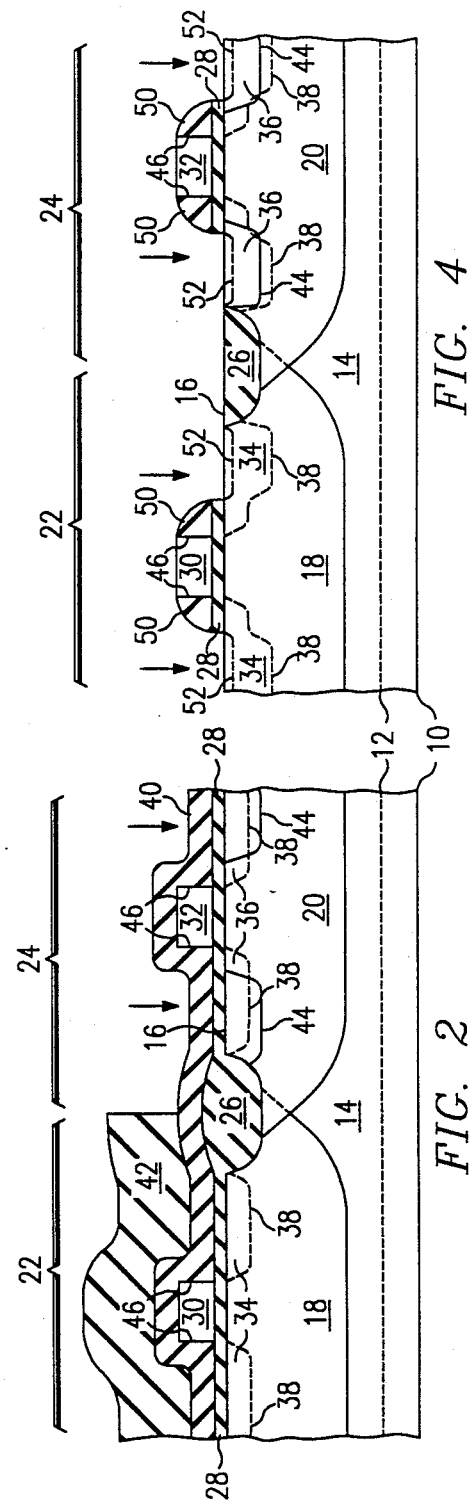

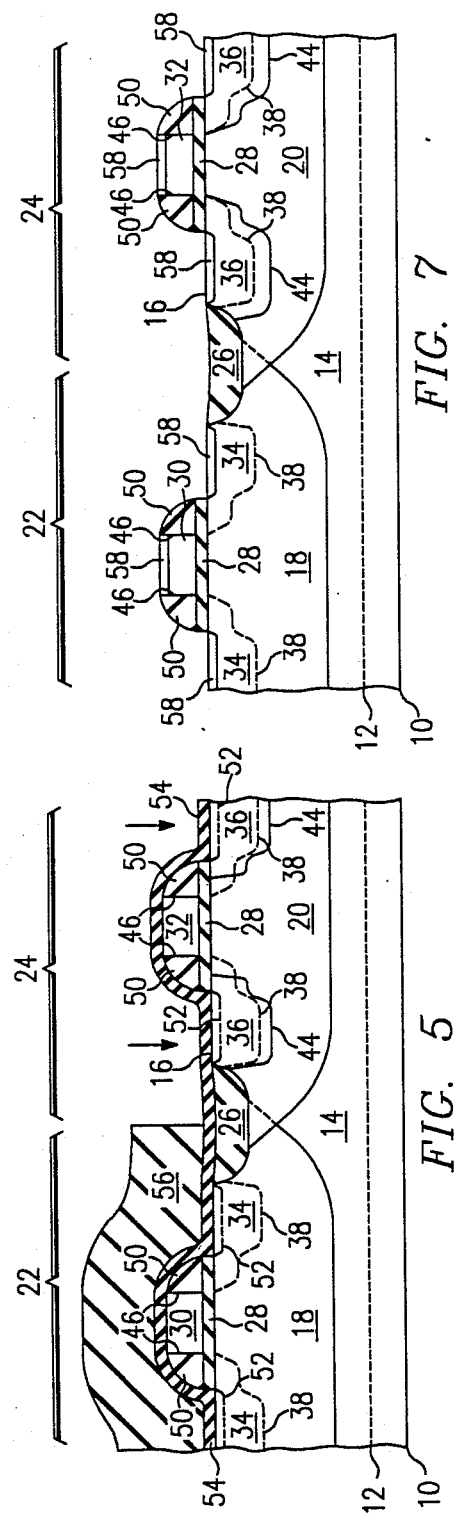
FIG. 5
FIG. 6
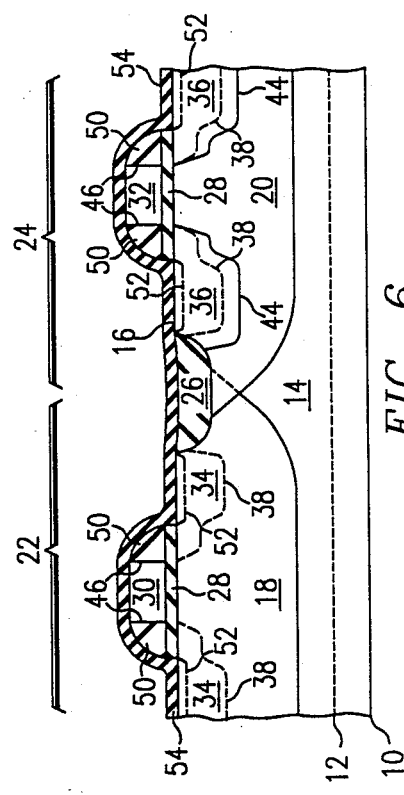
FIG. 7

COUNTER-DOPED TRANSISTOR

TECHNICAL FIELD OF THE INVENTION

The present invention relates generally to semiconductor devices. More specifically, the present invention relates to the fabrication of FETs wherein a minimal number of masking steps are utilized in the formation of sources and drains.

BACKGROUND OF THE INVENTION

In conventional processes for the fabrication of CMOS integrated circuits which include both N channel FETs and P channel FETs, many masking steps are required. For example, the fabrication of sources and drains of FETs having lightly-doped drain extensions, sometimes referred to as reach-throughs, conventionally requires four masking steps. One masking step protects P channel FETs while a lightly-doped drain extension is implanted for N channel FETs. Another masking step protects N channel FETs while a lightly-doped drain extension is implanted for P channel FETs. Still another masking step protects P channel FETs while sources and drains are implanted for N channel FETs. Moreover, yet another masking step protects N channel FETs while sources and drains are implanted for P channel FETs.

It is desirable to minimize the number of masking steps needed to fabricate semiconductor devices. The removal of a masking step in a fabrication process improves device yield and directly reduces manufacturing costs. Consequently, a need exists for a process and a resulting structure which require fewer than four masking steps in the fabrication of sources and drains for N channel and P channel CMOS FETs.

SUMMARY OF THE INVENTION

Accordingly, it is an advantage of the present invention that an improved semiconductor device fabrication process is provided which reduces the number of required masking steps.

Another advantage is that the present invention provides an operable transistor in which source and drain regions include significant quantities of both N and P type dopants.

The above and other advantages of the present invention are carried out in one form by a process in which a gate region is formed at a semiconducting surface area of a substrate. After formation of the gate, a dopant having a first conductivity type is introduced into the substrate on opposing sides of the gate. Moreover, a second dopant having a second conductivity type is introduced into the substrate on the opposing sides of the gate. However, the second dopant is introduced at a greater dosage than the dosage used to introduce the first dopant.

The above and other advantages of the present invention are carried out in another form by a substrate which has semiconductor surfaces thereon. A tank region resides in the substrate at one of the surface areas. The tank region contains a dopant of a first conductivity type at a first concentration level. A gate region is formed at the substrate surface overlying the tank region. Moreover, first and second conductive regions, which serve as a source and a drain, are located at the substrate surface on opposing sides of the gate. Each of these source and drain regions contains a second dopant of the first conductivity type, but at a second concentration level which is greater than the first concentration level. Furthermore, each of the source and drain regions contains a dopant of a second conductivity type, and the concentration level of the second conductivity type dopant is greater than the concentration level of the first conductivity type dopant.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

FIG. 1 shows a schematic, cross-sectional side view of the present invention at a first stage of fabrication;

FIG. 2 shows a schematic, cross-sectional side view of the present invention at a second stage of fabrication;

FIG. 3 shows a schematic, cross-sectional side view of the present invention at a third stage of fabrication;

FIG. 4 shows a schematic, cross-sectional side view of the present invention at a fourth stage of fabrication;

FIG. 5 shows a schematic, cross-sectional side view of the present invention at a fifth stage of fabrication;

FIG. 6 shows a schematic, cross-sectional side view of the present invention at a sixth stage of fabrication; and FIG. 7 shows a schematic, cross-sectional side view of the present invention at a seventh stage of fabrication.

DETAILED DESCRIPTION OF THE PREFERRED EMBODIMENTS

FIGS. 1-7 illustrate a process used in forming two CMOS FETs. One of the two CMOS FETs is an N channel device, and the other is a P channel device A single portion of an entire slice 10 and a single cross-sectional sideview is presented throughout the FIGURES. Although only two FETs are shown in the FIGURES, those skilled in the art will recognize that a single semiconductor device may include many N channel and P channel devices constructed according to the teaching presented herein.

FIG. 1 shows slice 10 at a fabrication stage which begins the formation of sources and drains for the two FETs. Thus, slice 10 in the stage illustrated in FIG. 1 includes a monocrystalline silicon substrate 12 in which an epitaxial layer 14 has been grown. A semiconductor surface 16 of epitaxial layer 14 provides a surface upon which the FETs of the present invention are fabricated. A P tank region 18 is formed in epitaxial layer 14 at surface 16 in the locations of slice 10 where N channel FETs are to be formed. Likewise, an N tank region 20 is formed in epitaxial layer 14 at surface 16 in the areas of slice 10 where P channel FETs are to be formed. Alternatively, N tank and P tank regions 20 and 18, respectively, may be formed directly into slice 10 without the addition of epitaxial layer 14. FIG. 1 generally indicates the area of slice 10 in which an N channel FET is to be formed as area 22 and the area of slice 10 where a P channel FET is to be formed as area 24.

At the intersection between N channel area 22 and P channel area 24 on surface 16, a field insulator region 26, which consists of a relatively thick oxide, has been grown or deposited. A gate oxide 28 resides on the remaining areas of surface 16. Moreover, N channel area 22 and P channel area 24 contain N channel gate 30 and P channel gate 32, respectively. Gates 30 and 32 are each formed by depositing polysilicon to a thickness of around 4,500 angstroms or less, doping the polysilicon, and then patterning and etching the polysilicon so that gate structures 30 and 32 remain, as shown in FIG. 1. The etching of the polysilicon may sacrifice a small portion of gate oxide 28 and field oxide 26, but the majority of these oxides remain. Thus, at this stage in the preferred embodiment, the thickness of gate oxide 28 not covered by polysilicon gates 30 or 32 may advantageously be 200 angstroms or less.

The structure shown in FIG. 1 and discussed above is fabricated in the preferred embodiment using conventional processes. As a result of such conventional processes, epitaxial layer 14 contains a P type dopant dispersed through the crystalline structure thereof at a relatively low concentration. P tank region 18 contains a P type dopant, such as boron, so that the resulting dopant concentration is in the order of 0.1E17 to 1.0-E17 atoms/cm$^3$. However, N tank region 20 contains an N type dopant, such as arsenic or phosphorous, so that the resulting N type dopant concentration is around 1.0E16 to 1.0E17 atoms/cm$^3$. Moreover, slice 10 may include an implant (not shown) into substrate 12 at the region which resides within tanks 18 and 20 at surface 16 directly underneath gates 30 and 32. This implant occurs before deposition of polysilicon for gates 30 and 32. A typical gate implant includes a P type dopant, such as boron, at a concentration in the order of 1E16 to 1E17 atoms/cm$^3$.

The structure shown in FIG. 1 and described above is implanted with an N type dopant, such as arsenic or phosphorous, in a blanket, unmasked, implantation process. This implantation process introduces into substrate 12 the dopant which forms lightly-doped drain extensions for N channel FETs. However, it subjects the entire surface of slice 10 to the N type dopant. The preferred embodiment utilizes arsenic for the N type dopant at this stage in the fabrication process because arsenic has a lower diffusion rate than phosphorous. Consequently, the implanted arsenic tends to diffuse laterally underneath gates 30 and 32 less than would occur if phosphorous were used for the N type dopant.

The preferred embodiment utilizes arsenic at a dosage of around 0.5E13 to 4.0E13 atoms/cm$^2$ at an energy level sufficient to drive the dopant through gate oxide 28 into substrate 12 at surface 16. Thus, the N type dopant becomes implanted in subtrate 12 at all locations of layer 14 which do not underlie gates 30–32 or field insulator region 26. Consequently, N channel source and drain (S/D) regions 34 and P channel S/D regions 36 are defined by the volume of layer 14 surrounded by surface 16 and an N channel diffusion front 38. N channel diffusion front 38 is denoted by a dotted line in FIG. 1. A concentration of around 1E17 to 1E18 atoms/cm$^3$ of N type dopant resides in regions 34 and 36 as a result.

FIG. 2 illustrates a subsequent stage in the fabrication of the present invention. After the implantation of N type dopant, the preferred embodiment forms an insulating layer 40 overlying the entire surface of slice 10. The preferred embodiment deposits a TEOS layer approximately 300–1,000 angstroms thick for layer 40. After the application of layer 40, a photoresist layer 42 is applied overlying N channel area 22. Photoresist layer 42 does not overlie P channel area 24.

After application of resist 42, the process of the present invention next implants a P type dopant through layers 40 and 28 into substrate 12. This implantation process introduces into substrate 12 the dopant which forms lightly-doped drain extensions for P channel FETs. The preferred embodiment utilizes boron for this implantation step at a dosage of around 1E14 to 5E14 atoms/cm$^2$ at an energy level of around 50 Kev so that a resulting concentration of P type dopant in regions 36 is around 1E20 atoms per cm$^3$. The dosage of P type dopant is not a critical factor so long as it is greater than the dosage of the N type dopant discussed above in connection with FIG. 1. Consequently, the P type dopant overcompensates regions 36, and regions 36 exhibit a P type conductivity. A resulting P type diffusion front 44, shown as a solid line in FIG. 2, generally extends deeper into layer 14 than N type diffusion front 38.

Insulator layer 40 covers all features at the surface of slice 10. Consequently, insulator layer 40 resides on sidewalls 46 of gates 30 and 32. The vertical thickness of insulator layer 40 extending laterally outward from gate 32 at sidewalls 46 is sufficient to substantially block the implantation of P type dopant thereunder. As a result of this blockage, P type diffusion front 44 is laterally spaced away from gate 32 after this implanting step. This spacing away of diffusion front 44 compensates for a relatively large diffusion rate that characterizes P type dopant and assures that after an annealing step (discussed below) diffusion front 44 will underlie gate 32 only a desirably minimal amount.

On the other hand, insulating layer 40 is not so thick that a lateral straggle phenomenon causes an excessive amount of P type dopant to diverge laterally after travelling through layer 40 so that it resides near gate 32. In an alternate embodiment of the present invention, insulator layer 40 may be thermally grown in conditions which promote growth on polysilicon gates 30 and 32 at a faster rate than overlying monocrystalline layer 14. For example, such a process may grow layer 40 to a thickness of around 500 angstroms on gate 32 while growing layer 40 overlying substrate 12 only about 50 angstroms. This alternate embodiment spaces diffusion front 44 away from gate 32 without significantly increasing lateral straggle.

The implantation of P type dopant discussed above does not affect N channel area 22 because resist 42 is sufficiently thick to block passage of the P type dopant therethrough. Consequently, regions 34 do not change as a result of this stage. Referring to FIG. 3, the process for fabricating the present invention next strips resist 42 (see FIG. 2) from slice 10 and applies an insulating layer 48 over the entire surface of slice 10. In other words, layer 48 overlies insulator layer 40. The preferred embodiment deposits a TEOS oxide so that the entire oxide thickness provided by layers 40 and 48 is in the range of 1,000 to 2,500 angstroms.

As illustrated by FIG. 4, the process next isotropicly etches layers 40 and 48 to expose silicon surface 16. Sidewall insulators 50 result from this isotropic etching task. Sidewall insulator 50 and surface 16 reside on vertically opposing sides of gate oxide 28, and sidewall insulators 50 contact sidewalls 46 of gates 30 and 32. The lateral width of each of sidewall insulators 50 is around 2,000 angstroms or less in the preferred embodiment, and the vertical thickness of sidewall insulators 50 approximately equals the thickness of gates 30 and 32.

Next, the process of the present invention implants an N type dopant over the entire surface of slice 10. This implantation process introduces into substrate 12 the dopant which forms the sources and drains of N channel FETs. The preferred embodiment utilizes phosphorous at a dosage of around 4E14 atoms/cm$^2$. This dosage is not a critical feature of the present invention so long as it is greater than the N type dopant dosage used above in connection with FIG. 1. As shown in FIG. 4, this dosage expands N type dopant diffusion front 38 deeper into substrate 12 underlying portions of surface 16 where the N type dopant is applied. However, sidewall insulators 50 substantially block passage of the N type dopant in this implanting step. Thus, this higher dosage portion of N type dopant is laterally spaced away from gates 30 and 32 by the width of sidewall insulators 50.

The present invention contemplates alternate embodiments at this stage of the fabrication process. A first alternate embodiment additionally implants a second N type dopant following the implantation of the N type dopant described immediately above. The preferred embodiment implants arsenic at a dosage of around 3E15 atoms/cm$^2$ in this additional implantation step. Arsenic is preferred because it has a shorter range than phosphorous, and the higher dosage is utilized so that a contact resistance with a later-formed silicide (discussed below) will be minimized. An arsenic diffusion front 52, which is denoted by a dotted line in FIG. 4, illustrates the portion of regions 34 and 36 which contain this arsenic dopant.

In another alternate embodiment of the present invention, a separate masking step which applies a photoresist (not shown) overlying area 24 of slice 10 is performed prior to the implantation of N type dopants as discussed above in connection with FIG. 4. This photoresist blocks the implantation of such dopants into area 24 of slice 10. However, this step is performed only in applications which cannot tolerate a minimal reduction in P channel transistor performance that may occur from the inclusion of a substantial quantity of N type dopant in regions 36.

FIG. 5 illustrates stages which occur in the fabrication of the present invention subsequent to the stage illustrated by FIG. 4, regardless of whether any or all of the alternate embodiments discussed above occur. In FIG. 5, an insulating layer 54, such as a 300 angstrom thick LPCVD oxide, is formed overlying the entire surface of slice 10. Next, a photoresist 56 is applied overlying N channel area 22 but not overlying P channel area 24. Insulating layer 52 protects surface 16 from the potentially damaging effects of photoresist layer 56 and a developer which is used to strip resist layer 56. Moreover, layer 54 protects surface 16 during a later-occurring annealing step.

After the application of resist layer 56, the process of the present invention implants a P type dopant over the entire surface of slice 10. However, resist layer 56 blocks P type dopant from becoming implanted in area 22. Consequently, only area 24 becomes implanted with P type dopant during this step. This implantation process introduces into substrate 12 the dopant which forms the sources and drains of P channel FETs. The preferred embodiment utilizes boron in this step at a dosage of around 4E15 atoms/cm$^2$ so that a concentration of around 1E20 to 1E21 atoms/cm$^3$ results. The precise dosage of P type dopant utilized at this step is not critical so long as it is greater than both the N type dopant utilized above in connection with FIG. 4 and the P type dopant utilized above in connection with FIG. 1. As shown in FIG. 5, this dosage of P type dopant drives P type diffusion front 44 deeper into substrate 12 underlying portions of surface 16 which are not blocked.

Sidewall insulators 50 operate to laterally space this relatively high concentration P type dopant away from gate 32. As a result, only the low concentration N type dopant discussed above in connection with FIG. 1 resides near gate 32. The low concentration P type dopant discussed above in connection with FIG. 2 is laterally spaced away from gate 32 but resides closer to gate 32 than the relatively high concentration P type dopant implanted as result of the present step.

FIG. 6 illustrates an annealing step which occurs after the implantation step discussed above in connection with FIG. 5. First, resist layer 56 is stripped from slice 10 so that insulating layer 54 remains overlying slice 10. Next, slice 10 is annealed for a period of time in the range of 25–95 minutes, but preferably around 65 minutes, at approximately 900° C. This step "drives-in" the N type and P type dopants implanted as discussed above in connection with FIGS. 1–5, causing these dopants to diffuse both laterally and vertically within substrate 12. Thus, diffusion fronts 38 and 44 expand within substrate 12 relative to their positions shown in FIGS. 1–5. As a result of this diffusion, the less heavily doped portions of regions 34 and 36 reside under only a small part of gates 30 and 32 at sidewalls 46 thereof. These lesser doped regions form lightly doped drain extensions, or reach-throughs, for the FET formed in regions 22 and 24.

Moreover, in P channel area 24 P channel S/D region 36 entirely encompasses N type diffusion front 38 residing therein. This results because the P type boron dopant diffuses faster than either the arsenic or phosphorous N type dopants. Consequently, area 24 forms a FET having counter-doped source and drain regions. Since the concentration of P type dopant in these regions is greater than the concentration of N type dopants, the regions exhibit a P type conductivity.

FIG. 7 illustrates a stage in the fabrication of the present invention where a silicide is formed which is used in making contacts to source, drain, and gate conductive regions of slice 10. In the preferred embodiment, insulating layer 54 (see FIG. 6) is stripped to expose bare silicon at surface 16 and gates 30 and 32. Next, titanium is deposited to a thickness of around 900 angstroms and formed into TiSi$_2$ by placing slice 10 at a temperature of around 655° C. for around 60 minutes. Excess titanium is then removed and slice 10 again annealed at around 800=° C. for about 30 minutes. Silicides 58 form as a result. In the preferred embodiment, arsenic diffusion front 52, discussed above in connection with FIG. 4, is substantially consumed by silicide 58 in areas 22 and 24. Consequently, a desirably low contact resistance may be made with S/D regions 34 in area 22, and the performance characteristics of the P channel transistor formed in area 24 are minimally degraded by the presence of N type dopant in P type source and drain regions thereof.

Those skilled in the art will recognize that slice 10 may now undergo additional steps to complete fabrication of an entire semiconductor device. Such additional steps may include the formation of interconnect levels, various sealing and protecting levels, and the like.

In summary, the present invention discusses N channel and P channel FETs which are simultaneously formed using fewer than four masking steps in the formation of source and drain regions. The preferred embodiment produces a P channel transistor which includes a significant quantity of both N type and P type dopant in source and drain regions. However, the diffusion front for P type source and drain regions extends beyond a corresponding diffusion front for N type dopant in the same regions. Thus, such regions act as P type conductors. The use of both N type and P type dopant in source and drain regions may increase series resistance. However, such higher resistance may be tolerated in a P channel transistor. Thus, the counter-doping which occurs in P type transistors in the present invention has only a minimal effect on performance.

The present invention has been described above with reference to preferred embodiments. However, those skilled in the art will recognize that changes and modifications may be made in these preferred embodiments without departing from the scope of the present invention. For example, the present invention may be utilized in connection with a wide variety of layout rules. The preferred embodiment contemplates use of the present invention in connection with 2 micron to ½ micron CMOS processes. Moreover, the specific doses, concentrations, and dimensions presented herein are used for purposes of example only and may be changed and modified to meet specific application requirements. These and other changes and modifications which are obvious to those skilled in the art are intended to be included within the scope of the present invention.

What is claimed is:

1. A method for forming a field effect transistor having lightly doped regions, comprising the steps of:
   providing a substrate;
   forming a patterned layer on said substrate;
   performing a first implantation of first dopant atoms into said substrate, said first dopant atoms having a characteristic of forming regions of a first conductivity type when implanted into said substrate, said patterned layer serving as a mask to prevent implantation of said first dopant atoms in said substrate;
   forming first spacer layers on at least one sidewall of said patterned layer;
   performing a second implantation of second dopant atoms into said substrate, said second dopant atoms having a characteristic of forming regions of a second conductivity type when implanted into said substrate, said patterned layer and said spacer layers serving as a mask to prevent implantation of said second dopant atoms, said second dopant atoms having a higher rate of diffusion in said substrate than said first dopant atoms;
   forming a second spacer layers on said first spacer layers;
   performing a third implantation of third dopant atoms into said substrate, said third dopant atoms having a characteristic of forming regions of a first conductivity type when implanted into said substrate, said patterned layer, said first spacer layers and said second spacer layers serving as a mask to prevent implantation of said third dopant atoms in said substrate;
   forming third spacer layers on said second spacer layers;
   performing a fourth implantation of fourth dopant atoms into said substrate, said fourth dopant atoms having a characteristic of forming regions of a second conductivity type when implanted into said substrate, said patterned layer and said first second and third spacer layers serving as a mask to prevent implantation of said fourth dopant atoms, said fourth dopant atoms having a higher rate of diffusion in said substrate than said third dopant atoms;
   heating said substrate to diffuse said first, second, third and fourth dopant atoms into said substrate.

2. A method as in claim 1 wherein said substrate comprises crystalline silicon.

3. A method as in claim 1 wherein said patterned layer comprises a conductive layer separate from said substrate by an insulating layer.

4. A method as in claim 3 wherein said conductive layer serves as a gate to control the conductivity of said substrate beneath said gate.

5. A method as in claim 1 wherein said first and third dopant atoms are the same and said second and fourth dopant atoms are the same.

6. A method as in claim 5 wherein said first dopant atoms are N type dopant atoms and said second dopant atoms are P type dopant atoms.

7. A method as in claim 6 wherein said first dopant atoms are Arsenic atoms and said second dopant atoms are Boron dopant atoms.

8. A method as in claim 1 wherein said first dopant atoms are N type dopant atoms and said second dopant atoms are P type dopant atoms.

9. A method as in claim 8 wherein said first dopant atoms are Arsenic atoms and said second dopant atoms are Boron dopant atoms.

10. A method for forming a field effect transistor having lightly doped regions, comprising the steps of:
    providing a substrate having a first device area and a second device area;
    forming a patterned layer on said substrate;
    performing a first implantation of first dopant atoms into said substrate, said first dopant atoms having a characteristic of forming regions of a first conductivity type when implanted into said substrate, said patterned layer serving as a mask to prevent implantation of said first dopant atoms in said substrate;
    forming first spacer layers on at least one sidewall of said patterned layer;
    forming and patterning a first masking layer on said substrate, said first masking layer protecting said second device area;
    performing a second implantation of second dopant atoms into said substrate, said second dopant atoms having a characteristic of forming regions of a second conductivity type when implanted into said substrate, said patterned layer, said first masking layer and said spacer layers serving as a mask to prevent implantation of said second dopant atoms, said second dopant atoms having a higher rate of diffusion in said substrate than said first dopant atoms;
    forming second spacer layers on said first spacer layers;
    performing a third implantation of third dopant atoms into said substrate, said third dopant atoms having a characteristic of forming regions of said first conductivity type when implanted into said substrate, said patterned layer, said first spacer layers and said second spacer layers serving as a mask to prevent implantation of said third dopant atoms in said substrate;
    forming third spacer layers on said second spacer layers;

forming and patterning a second masking layer on said substrate, said second masking layer protecting said second device area;

performing a fourth implantation of fourth dopant atoms into said substrate, said fourth dopant atoms having a characteristic of forming regions of said second conductivity type when implanted into said substrate, said patterned layer, said second masking layer and said first, second and third spacer layers serving as a mask to prevent implantation of said fourth dopant atoms, said fourth dopant atoms having a higher rate of diffusion in said substrate than said third dopant atoms;

heating said substrate to diffusion said first, second, third and fourth dopant atoms into said substrate.

11. A method as in claim 10 wherein said substrate includes a first well formed in said first device area having a conductivity type opposite that formed by said second dopant atoms when introduced into said substrate and a second well formed in said substrate at said second device area having a conductivity type opposite that formed by said first dopant atoms when introduced into said substrate.

12. A method as in claim 10 wherein said substrate comprises crystalline silicon.

13. A method as in claim 10 wherein said patterned layer comprises a conductive layer separated from said substrate by an insulating layer.

14. A method as in claim 13 wherein said conductive layer serves as a gate to control the conductivity of said substrate beneath said gate.

15. A method as in claim 10 wherein said first and third dopant atoms are the same and said second and fourth dopant atoms are the same.

16. A method as in claim 15 wherein said first dopant atoms are N type dopant atoms and said second dopant atoms are P type dopant atoms.

17. A method as in claim 16 wherein said first dopant atoms are Arsenic atoms and said second dopant atoms are Boron dopant atoms.

18. A method as in claim 10 wherein said first dopant atoms are N type dopant atoms and said second dopant atoms are P type dopant atoms.

19. A method as in claim 18 wherein said first dopant atoms are Arsenic atoms and said second dopant atoms are Boron dopant atoms.

* * * * *